United States Patent
Zhou et al.

(10) Patent No.: US 7,880,570 B2
(45) Date of Patent: Feb. 1, 2011

(54) FEED THRU WITH FLIPPED SIGNAL PLANE USING GUIDED VIAS

(75) Inventors: Jianying Zhou, Acton, MA (US); Yuheng Lee, San Jose, CA (US); Yan Yang Zhao, Fremont, CA (US); Bernd Huebner, Santa Clara, CA (US)

(73) Assignee: Finisar Corporation, Sunnyvale, CA (US)

( * ) Notice: Subject to any disclaimer, the term of this patent is extended or adjusted under 35 U.S.C. 154(b) by 234 days.

(21) Appl. No.: 12/259,202

(22) Filed: Oct. 27, 2008

(65) Prior Publication Data

US 2009/0267712 A1    Oct. 29, 2009

Related U.S. Application Data

(60) Provisional application No. 60/982,666, filed on Oct. 25, 2007.

(51) Int. Cl.
H01P 3/00 (2006.01)
(52) U.S. Cl. ............. 333/260; 333/246; 333/33
(58) Field of Classification Search ........... 333/33, 333/34, 238, 246, 260, 254
See application file for complete search history.

(56) References Cited

U.S. PATENT DOCUMENTS

| | | | |
|---|---|---|---|
| 4,626,805 A * | 12/1986 | Jones ............... | 333/33 |
| 5,561,405 A | 10/1996 | Hoffmeister et al. | |
| 5,675,302 A * | 10/1997 | Howard et al. ........ | 333/243 |
| 6,062,872 A | 5/2000 | Strange et al. | |
| 6,599,031 B2 | 7/2003 | Li | |
| 6,614,325 B1 | 9/2003 | Kocin | |
| 6,661,316 B2 * | 12/2003 | Hreish et al. ........ | 333/246 |
| 6,876,836 B2 | 4/2005 | Lin et al. | |
| 6,949,992 B2 | 9/2005 | Sweeney et al. | |
| 7,076,123 B2 | 7/2006 | Kirkpatrick et al. | |
| 7,394,337 B2 * | 7/2008 | Arai et al. ........ | 333/260 |
| 2003/0222282 A1 | 12/2003 | Fjelstad et al. | |
| 2005/0224946 A1 | 10/2005 | Dutta | |
| 2005/0237137 A1 | 10/2005 | Dutta | |
| 2005/0239418 A1 | 10/2005 | Koh et al. | |
| 2006/0028305 A1 | 2/2006 | Dutta et al. | |
| 2008/0191818 A1 | 8/2008 | Lee et al. | |

FOREIGN PATENT DOCUMENTS

KR   2005-0030022   3/2005

* cited by examiner

*Primary Examiner*—Stephen E Jones
(74) *Attorney, Agent, or Firm*—Workman Nydegger

(57) ABSTRACT

An embodiment of the invention includes a high speed feed thru connecting a first circuit outside a housing to a second circuit inside the housing. The first circuit includes a first high speed integrated circuit chip and the second circuit includes a second high speed integrated circuit chip or optoelectronic device. The high speed feed thru includes an inside coplanar structure positioned at least partially inside the housing, the inside coplanar structure connected to the second circuit. The high speed feed thru also includes an outside coplanar structure positioned at least partially outside the housing, the outside coplanar structure connected to the first circuit. A material separates the inside coplanar structure and the outside coplanar structure. At least one guided via extends through the material, connecting the inside coplanar structure and the outside coplanar structure.

11 Claims, 10 Drawing Sheets

_US 7,880,570 B2_

FEED THRU WITH FLIPPED SIGNAL PLANE USING GUIDED VIAS

CROSS-REFERENCE TO RELATED APPLICATIONS

This application claims the benefit of and priority to U.S. Provisional Patent Application Ser. No. 60/982,666 filed on Oct. 25, 2007 and entitled "Feed Thru With Flipped Signal Plane", which application is incorporated herein by reference in its entirety.

BACKGROUND OF THE INVENTION

High speed transponders and transceivers generally require multiple high speed interconnects. For example, a transponder may include various components that are interconnected with the intent of facilitating reliable high speed transmission. Typically, conventional interconnects in high speed transponders include coax cable and GPPO or V-connectors. Unfortunately, the ability to reliably achieve high speed transfer rates using conventional interconnects has several limitations.

The complexity and cost of establishing reliable high speed transfer rates is increased by the device configurations. While some high speed transponders and transceivers employ single-ended interconnects that require only one cable between components, other high speed transponders and transceivers employ differential interconnects that require two cables between components. Still other high speed transponders and transceivers employ multiple differential interconnects in a transmitter chain, and multiple differential signal interconnects in a receiver chain. As a result, employing conventional coax cable and GPPO or V-connectors as high speed interconnects may limit the viability of higher data transfer rates and can therefore limit the market potential of high speed transponders and transceivers.

BRIEF SUMMARY OF THE INVENTION

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

An embodiment of the invention includes a high speed feed thru connecting a first circuit outside a housing to a second circuit inside the housing. The first circuit includes a first high speed integrated circuit chip and the second circuit includes a second high speed integrated circuit chip or optoelectronic device. The high speed feed thru includes an inside coplanar structure positioned at least partially inside the housing, the inside coplanar structure connected to the second circuit. The high speed feed thru also includes an outside coplanar structure positioned at least partially outside the housing, the outside coplanar structure connected to the first circuit. A material separates the inside coplanar structure and the outside coplanar structure. At least one guided via extends through the material, connecting the inside coplanar structure and the outside coplanar structure. The signal plane of the inside coplanar structure is flipped with respect to the signal plane of the outside coplanar structure.

Another embodiment of the invention is a high speed device including a first high speed circuit connected to a first coplanar structure and a second high speed circuit connected to a second coplanar structure. The second coplanar structure is separated from the first coplanar structure by a separating medium. The high speed device also includes a high speed feed thru. The high speed feed thru includes a means for connecting the first coplanar structure and the second coplanar structure through the separating medium. The means for connecting has an impedance configured to match an impedance of the first coplanar structure and an impedance of the second coplanar structure.

A further embodiment of the invention includes a method for coupling a first coplanar structure to a second coplanar structure. The method includes placing a material between the first coplanar structure and the second coplanar structure. The material contains at least one guided via and the at least one guided via is configured to achieve an impedance match. The method also includes securing a first end of the at least one guided via to the first coplanar structure and securing the second end of the at least one guided via to the second coplanar structure. The signal plane of the first coplanar structure is flipped with respect to the signal plane of the second coplanar structure.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

In general, embodiments disclosed herein are directed to high speed feed thrus for electrically connecting electrical signal routes between integrated circuits (ICs) and/or opto-electric circuits (OCs) and/or packages that include ICs and/or OCs. The term "high speed" as used herein may refer to data rates of about 15 Gb/s or above. For example, the term "high speed" as used herein also encompasses data rates of about 40 Gb/s, 50 Gb/s, 60 Gb/s, 100 Gb/s and others, although one of skill in the art can appreciate that embodiments of the invention can be used with lower or higher data rates. Additionally, high speed feed thrus disclosed herein are scalable such that high speed data rates, such as 40 Gb/s, 100 Gb/s, or higher, can be accommodated.

Certain feed thrus disclosed herein enable high speed electrical signals, such as data, clock and other signals, to be transferred between packages using traces on a printed circuit board (PCB) that are configured for such transmission (e.g., PCB-based high speed interconnects). Moreover, some feed thrus disclosed herein are configured such that standard package configurations can be employed, obviating the need for specialized IC and OC packages commonly used in high speed transponders, such as GPPO equipped packages. Thus, embodiments of high speed feed thrus can be employed to simplify the complexity of transponder or transceiver design while enabling high speed signal transfer to occur between its constituent packages, components, ICs, and the like or any combination thereof.

Certain embodiments of a high speed feed thru include a guided via that is used to connect a high speed trace or transmission line on a first substrate with a high speed trace or transmission line on another substrate. The substrates that are connected by the guided via in this manner typically have different orientations. In one embodiment, the substrates have flipped signal planes and the guided via enables the transmission lines to be connected while maintaining the ability to achieve high speed data transfer rates. Embodiments of a high speed feed thru can be used in devices that utilize high speed data transfer between circuits and/or other components or from one module to another module, or from a device to a host, and the like.

Figure 1:
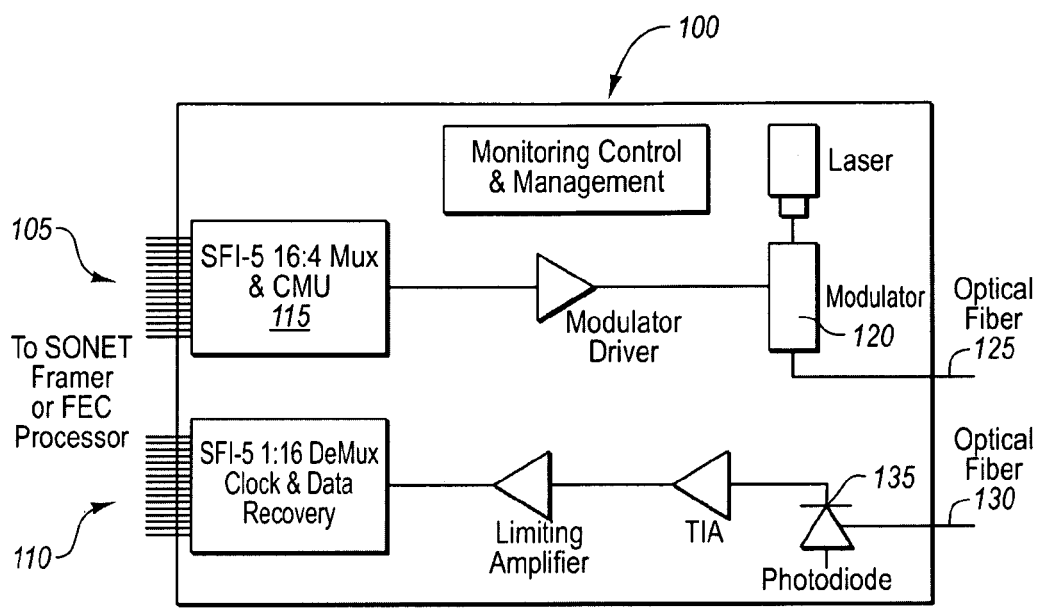
FIG. 1 illustrates an example of a high speed transponder.
Figure 2:
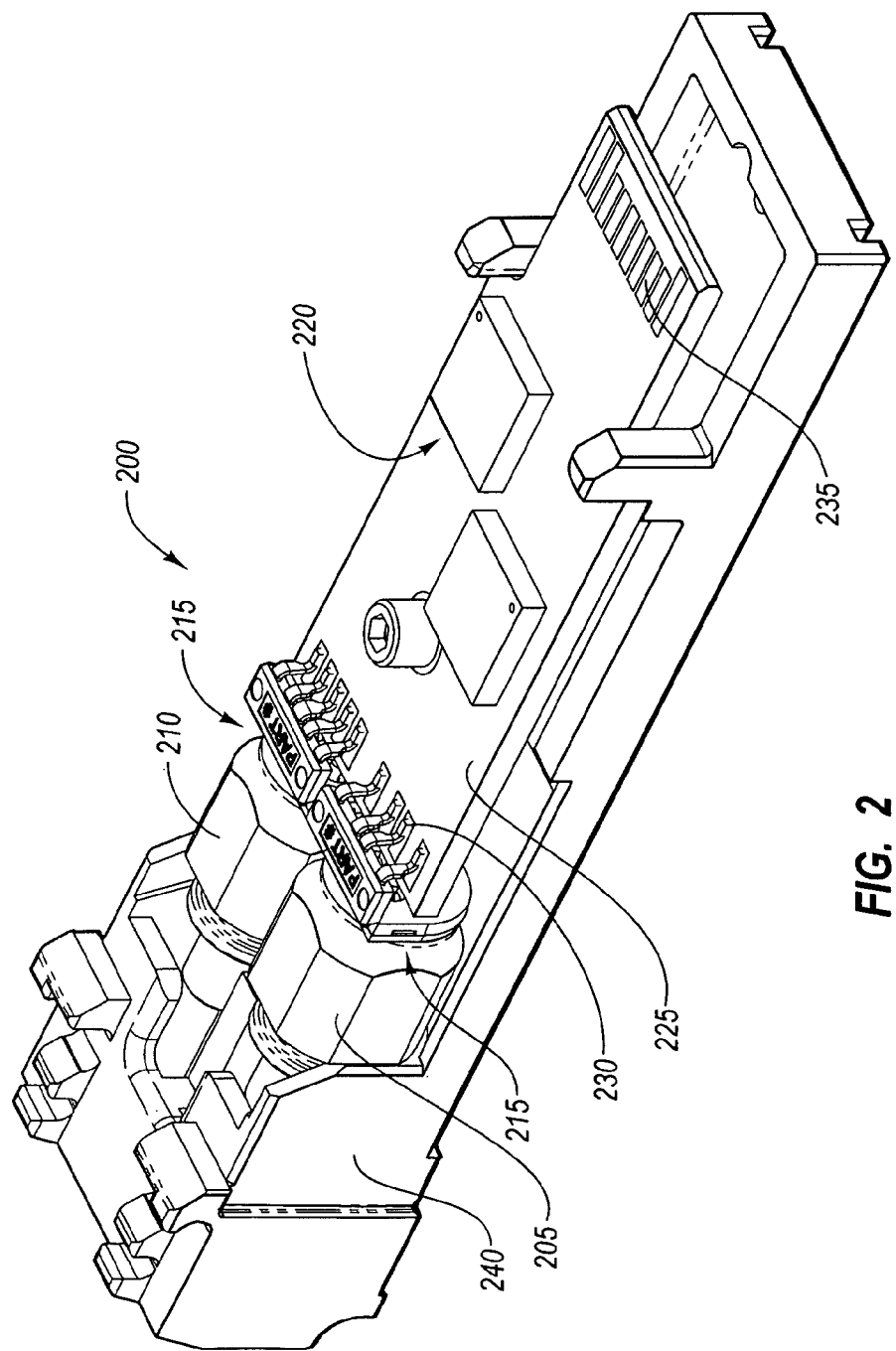
FIG. 2 illustrates an example of a transceiver.

FIGS. 1 and 2, by way of example only, illustrate high speed feed thrus in both transponders and transceivers. FIG. 1 illustrates an example of a high speed transponder in which the principles of the present invention may be implemented. However, one of skill in the art can appreciate that embodiments of the invention can also be employed in other devices or in systems of devices. In FIG. 1, the transponder 100 has multiple interconnects 105 and 110. The interconnects 105 and 110 can include one or more traces, by way of example only, and may also be used for connections that are external to the transponder 100 as well as internal to the transponder 100. A high speed feed thru can be connected to the transponder using the interconnects 105 and 110. The high speed feed thru can permit high speed communication between the transponder and an external device.

For an incoming signal at interconnect 105 a multiplexer 115 may be used to select the appropriate signal or signals. The selected signal is passed to a modulator 120 which may be used to control or modulate the output of a laser or drive the laser itself. The optical signal is then transmitted along a fiber optic cable 125. Incoming optical signals from an optical fiber 130 strike a photodiode 135 and are converted to an electrical signal to be output on a second interconnect 110. Each of the interconnects 105 and 110 can be implemented using aspects of the example high speed feed thrus disclosed herein. Further, the various components illustrated in FIG. 1 can be scaled as needed such that multiple signals can be processed simultaneously in both incoming and outgoing directions over the interconnects 105 and 110.

FIG. 2 illustrates an example of a transceiver 200 in which the principles of the present invention may be implemented. The example of the transceiver 200 includes various components, including a receiver optical subassembly (ROSA) 205, a transmitter optical subassembly (TOSA) 210, lead frame connectors 215, an integrated circuit controller 220, and a PCB 225. Two lead frame connectors 215 are included in the transceiver 200, one each used to electrically connect the ROSA 205 and the TOSA 210 to a plurality of conductive pads 230 located on the PCB 225. The controller 220 is also operably attached to the PCB 225. An edge connector 235 is located on an end of the PCB 225 to enable the transceiver 200 to electrically interface with a host. As such, the PCB 225 facilitates electrical communication between the ROSA 205/TOSA 210, and the host. In addition, the above-mentioned components of the transceiver 200 are partially housed within a housing portion 240. A shell can cooperate with the housing portion 240 to define a covering for the components of the transceiver 200.

The PCB 225 includes circuitry and electronic components mounted thereon for use with the TOSA 210 and ROSA 205 in performing the optical signal transmission and reception activities of the transceiver 200. Among the components of the PCB 225 are a laser driver, a post amplifier, and a controller 220. It will be appreciated that one or more of these components can be integrated on a single chip, or can be separately disposed on the PCB 225. In some embodiments, a high speed feed thru as disclosed herein can be connected to the transceiver 200 at the edge connector 235 for communication between the transceiver 200 and host. In other embodiments, a high speed feed thru as disclosed herein can be connected to the lead frame connectors 215 and the plurality of conductive pads 230 located on the PCB 225 for communication between the TOSA 210 and ROSA 205 and the PCB 225.

Figure 3:
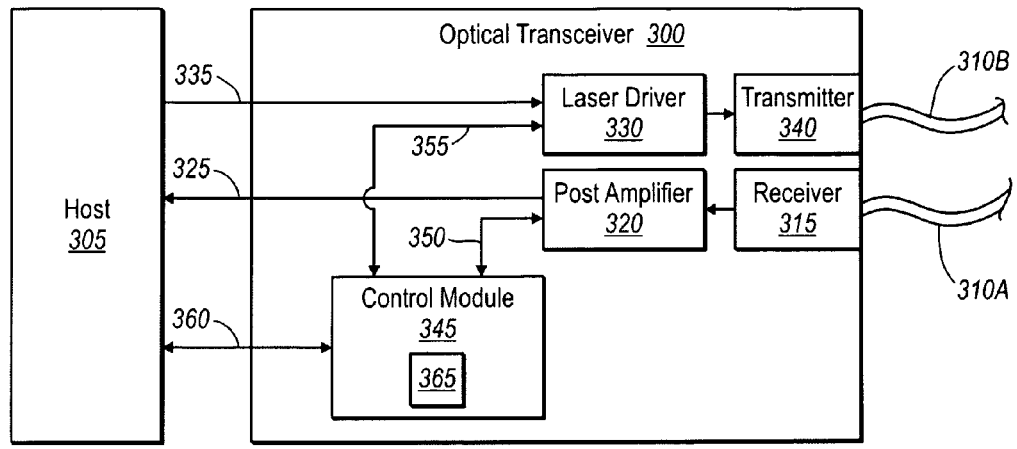
FIG. 3 illustrates an example of a transceiver connected to a host device.

FIG. 3 illustrates an example of a transceiver 300 connected to a host device 305, which can be any computing system capable of communication with the optical transceiver. As described above, a high speed feed thru as disclosed herein can be connected to the transceiver 300 at the edge connector for communication between the transceiver 300 and host 305. The transceiver 300 receives an optical signal from fiber 310A using receiver 315. The receiver 315 acts as an opto-electric transducer by transforming the optical signal into an electrical signal. The receiver 315 provides the resulting electrical signal to a post-amplifier 320. The post-amplifier 320 amplifies the electrical signal and provides the amplified signal to the external host 305 as represented by arrow 325. The external host 305 may be, in one example, a transceiver host box capable of housing and communicating with multiple transceivers.

The transceiver 300 may also receive electrical signals from the host 305 for transmission onto the fiber 310B. Specifically, the laser driver 330 receives an electrical signal from host 305 as represented by the arrow 335, and drives the transmitter 340 (e.g., a laser or Light Emitting Diode (LED)) to emit optical signals onto the fiber 310B, where optical signals are representative of the information in the electrical signal provided by the host 305. Accordingly, the transmitter 340 serves as an electro-optic transducer. Thus, the receiver 315 and transmitter 340 provide an optical connection to the optical fibers 310A and 310B. In some embodiments, the fibers 310A and 310B may be combined in a single coaxial optical fiber cable.

The transceiver 300 includes a control module 345, which may evaluate operating conditions, such as, but not limited to, temperature, voltage, and low frequency changes (such as receive power) from the post-amplifier 320 (as represented by arrow 350) and/or from the laser driver 330 (as represented by arrow 355). This allows the control module 345 to optimize the dynamically varying performance, and additionally detect when there is a loss of signal. The control module 345 can also control the operation of post amplifier 320, and/or laser driver 330, and, hence, can control the operation of transceiver 300.

Data may be exchanged between the control module 345 and host 305 using an appropriate interface or bus 360. In some embodiments, I²C is implemented as the data interface protocol between the host 305 and the control module 345 and data and clock signals may be provided from the host 305 using a serial clock line and a serial data line, both of which are represented by the bus 360. However, MDIO, 1-wire, or any other data interface protocol between the host 305 and the control module 345 can be implemented in the system.

The control module 345 may include one or more general purpose processors 365 or other computing devices such as a programmable logic device ("PLD"), application specific integrated circuit ("ASIC"), or field programmable gate array ("FPGA"). The one or more processors 365 recognize instructions that follow a particular instruction set, and may perform normal general-purpose operations such as shifting, branching, adding, subtracting, multiplying, dividing, Boolean operations, comparison operations, and the like. The control module may additionally include an internal control module memory, which may be Random Access Memory (RAM) or nonvolatile memory. While the internal control module memory may be RAM, it may also be a processor, register, flip-flop or other memory device.

The control module 345 may have access to a persistent memory external to the control module 345, which in one embodiment is an electrically erasable programmable read-only memory (EEPROM). Persistent memory may also be any other nonvolatile memory source. The persistent memory and the control module 345 may be packaged together in the same package or in different packages without restriction.

Figure 4:
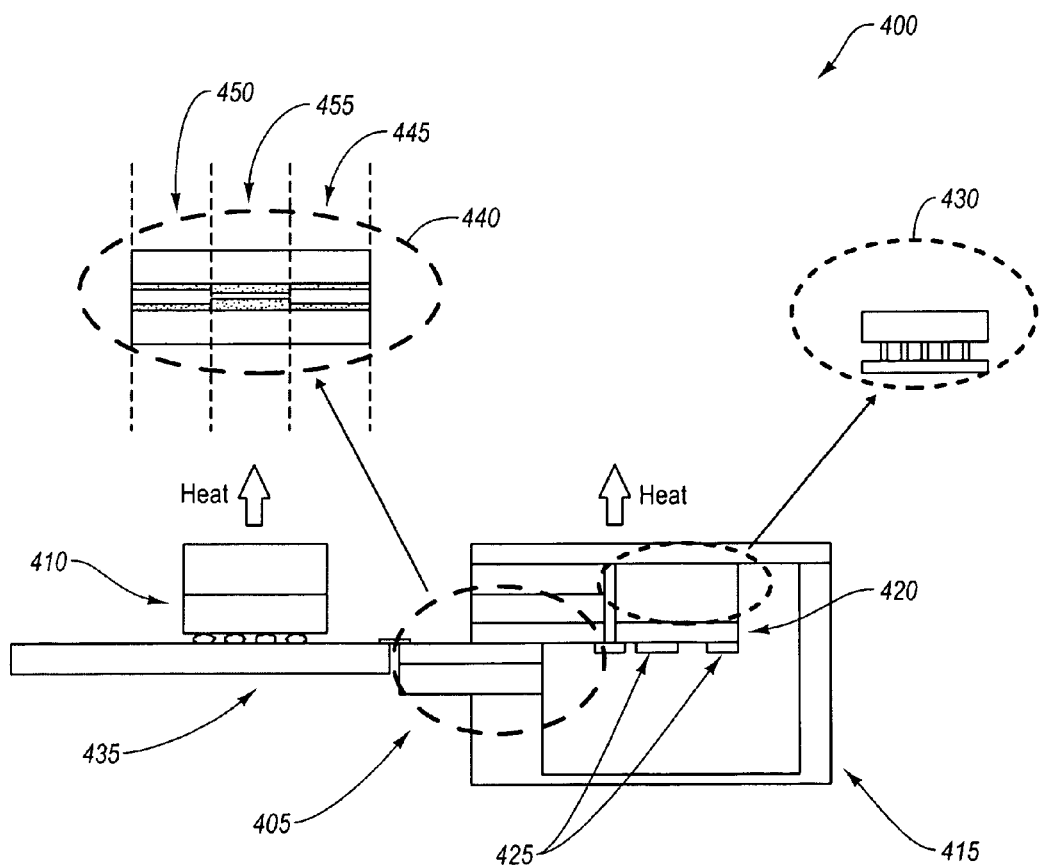
FIG. 4 illustrates an example of a system having an example feed thru.

FIG. 4 illustrates an example of a system 400 that includes a high speed feed thru 405. The feed thru 405 enables signals to pass from a first circuit 410 outside the housing 415 to a second circuit 420 inside the housing 415. In this example, the feed thru 405 electrically connects the first circuit 410 and the second circuit 420. In some embodiments, the first circuit 410 can include high speed integrated circuit chips, while the second circuit 420 can include high speed integrated circuit chips and optoelectronic devices 425 or any combination thereof. In some embodiments, the housing 415 can include a TOSA or a ROSA.

In certain embodiments, the first circuit 410 and/or second circuit 420 may also include a temperature control circuit (TEC) 430 and/or a heat sink. The first circuit 410 can be mounted on a PCB 435 with a set of high speed coplanar traces. The high speed coplanar traces are connected to the outside feed thru to facilitate a connection between the first circuit 410 and second circuit 420. The high speed traces provide the transmission lines for high speed communication between the circuits 410 and 420. The high speed feed thru 405 effectively become an extension of the transmission lines as it connects the transmission lines from the circuit 410 to the circuit 420 or to additional high speed coplanar traces disposed in the housing 415 and connected to the circuit 420. As further described herein, the high speed thru 405 provides a manner to flip the signal plane and maintain the proper impedance for the connection between the circuits 410 and 420.

As disclosed in FIG. 4, the feed thru 405 flips the signal plane. That is, the signal plane relative to the components on one side of the feed thru is flipped relative to the signal plane relative to the components on the other side. Flipping of the signal plane can enable a heat sink for the second circuit 420 inside the housing 415 to be positioned in the same orientation (i.e. above the system 400) as a heat sink for the first circuit 410 mounted on the PCB 435, and thus simplify the thermal management of the system 400. A flipped signal plane can allow a single heat sink to be used for both the first circuit 410 and second circuit 420. This can simplify construction and reduce costs. The housing 415 may include a metal and/or thermal conductive material, for example, allowing the heat from the second circuit 420 to be transferred out of the housing 415 into a common heat sink. The configuration of the example feed thru 405 can enable signal integrity to be maintained when using a strong coupling, the structure of which will be described in greater detail below.

A view 440 of the example feed thru 405 illustrates the interconnect or feed thru of the inside coplanar structure 445 and the outside coplanar structure 450 using a strip line structure 455 through the housing 415. In other embodiments, the inside coplanar structure 445 can be in direct contact with the outside coplanar structure 450. In further embodiments, a guided via can be used to communicate the signals from the inside coplanar structure 445 to the outside coplanar structure 450 as described below. In some embodiments, the inside coplanar structure 445 and outside coplanar structure 450 can extend at least partially into the housing 415.

The inside coplanar structure 445 and outside coplanar structure 450 can carry signals from the second circuit 420 and first circuit 410, respectively. In some embodiments, the first circuit 410 can be mounted on a PCB 435 with a set of coplanar high speed traces that are connected to the outside coplanar structure 450. In some embodiments, the high speed feed thru 405 can be integrated into a transponder or a transceiver, a TOSA or ROSA forming the housing 415. The feed thru 405 can, therefore, operably connect the first circuit 410 and second circuit 420 using the inside coplanar structure 445 and the outside coplanar structure 450.

In some embodiments, the outside coplanar structure 450 is "upside-down" with respect to the inside coplanar structure 445. This results in the signal plane inside the housing 415 being flipped with respect to the signal plane outside the housing 415. The flip of the signal plane can generate mode change and discontinuity. As a result, signal integrity, represented by reflection (S11) and forward transmission (S21), may be degraded, particularly for higher frequencies. In order to avoid the negative effects of mode change and discontinuity, and depending on the operating frequencies required, the feed thru 405 can be configured with a strong coupling coplanar structure as described below. In some embodiments, strong coupling can negate the impact of mode change and discontinuity.

Figure 5A:
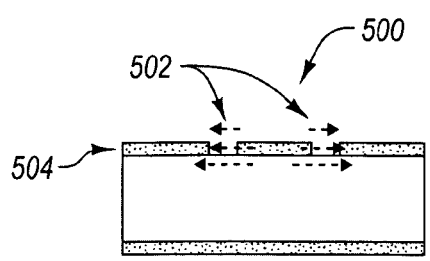
FIG. 5A illustrates an example of a strong coupling coplanar structure.
Figure 5B:
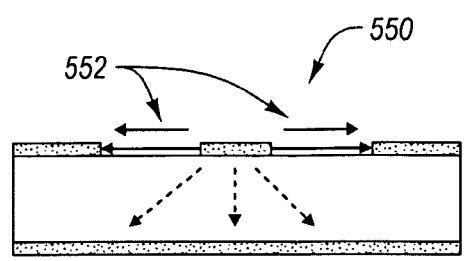
FIG. 5B illustrates an example of a weak coupling coplanar structure.

FIGS. 5A and 5B illustrate an example of a strong coupling coplanar structure 500 and a weak coupling coplanar structure 550, respectively. As disclosed in FIG. 5A, the electric fields 502 in the strong coupling coplanar structure 500 are concentrated in the signal plane 504 of the structure 500. In contrast, as disclosed in FIG. 5B, the electric fields 552 in the weak coupling coplanar structure 550 are spread throughout the structure 550.

Figure 6A:
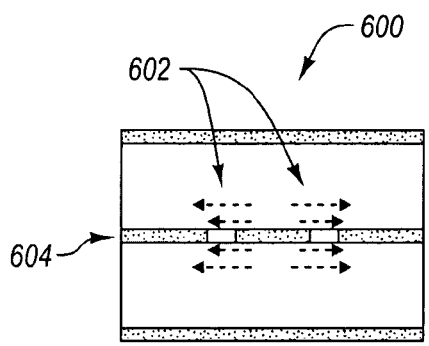
FIG. 6A illustrates an example of a strong coupling single-ended ground-signal-ground coplanar structure.
Figure 6B:
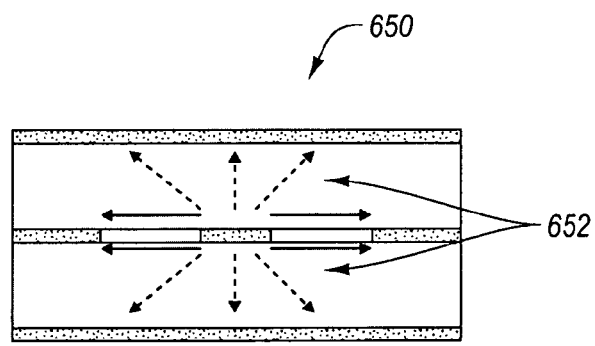
FIG. 6B illustrates an example of a weak coupling single-ended ground-signal-ground coplanar structure.

FIGS. 6A and 6B illustrate an example of a strong coupling single-ended ground-signal-ground (GSG) strip line structure 600 and a weak coupling single-ended GSG strip line structure 650. As disclosed in FIG. 6A, the field distributions 602 of the strong coupling strip line structure 600 can be concentrated to a signal plane 604 of the structure 600. In contrast, as disclosed in FIG. 6B, the field distribution 652 of the weak coupling strip line structure 650 spread throughout the structure. With a strong coupling, as illustrated in FIGS. 5A and 6A, the field mode change or discontinuity due to the signal plane flip can be minimized or eliminated and thus the frequencies of the spurious modes are moved to higher frequencies, as the signal plane is flipped by a high speed thru. This enables a device to operate at higher frequencies by using the feed thru disclosed herein configured with a strong coupling.

Figure 7:
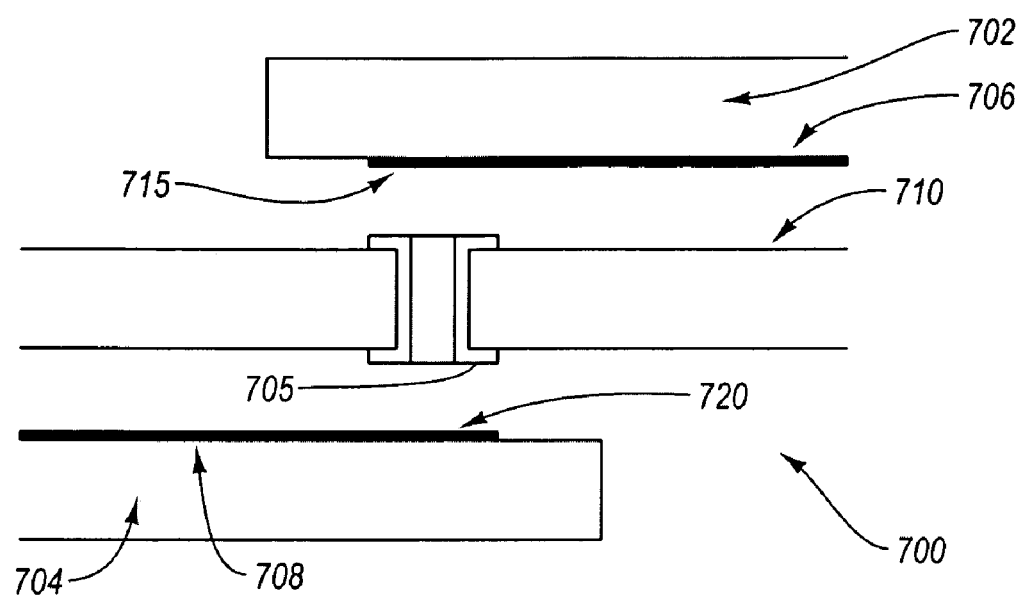
FIG. 7 illustrates an example of a via.

FIG. 7 illustrates an example of a high speed thru 700. FIG. 7 illustrates a substrate 702 that has a transmission line 706 disposed thereon. The transmission line 706 may be a high speed trace that is connected with a circuit on or off the substrate 702. The transmission line 706 terminates in this example with a pad 715. Similarly, the substrate 704 includes a transmission line 708 disposed thereon. The signal plane of the substrate 704 is flipped with respect to the signal plane of the substrate 702. The transmission line 708 also terminates in a pad 720.

In this example, the transmission line 706 is connected with the transmission line 708 by a via 705 that is formed in a material 710. The via 705 that can be used to transmit a signal carried by the transmission lines 706 and 708 through a material 710. In printed circuit board design, "via" refers to a plated hole that connects conductive tracks from one layer of the board to other layers. Either the holes are electroplated or small rivets are inserted or a conductive path may be created in some other way. High-density multi-layer PCBs may have blind vias, which are visible only on one surface, or buried vias, which are visible on neither.

In establishing a feed thru, the via 705 may be used to connect the transmission lines (e.g., traces) from one package (e.g., a circuit) to transmission lines to another package or circuit. In this example, the signal plane is flipped by transmitting through the via 705. The pads 715 and 720 can be connected to either end of the via 705 thus creating a conductive path from the first pad 715 to the second pad 720. In some embodiments, the via 705 can be a guided via which provides a conductive path of a specified impedance. For example, the pads 715 and 720 can be shaped to ensure a conductive pathway between the pads 715 and 720 through the via 705 and to control the impedance of the connection.

In some embodiments, the via 705 can be configured to achieve a desired impedance. In some instances, the via 705 may also be configured to control the impedance of the feed thru 700. The via 705 may have a certain shape, width, cross sectional shape, hollowness, height, and the like or any combination thereof. Configuring the via 705 can also be accomplished through composition of the via 705, the conductive material used in the via 705, the size of the via 705, the connection between the via 705 and a coplanar structure, a signal guided via surrounded by a ground guided via, or through some other method or structure. For example, if the inside coplanar structure and the outside coplanar structure have a GSG structure with an impedance of 50 Ohms, the via 705 can be configured to also have an impedance of 50 Ohms. Alternatively, if the inside coplanar structure and outside coplanar structure have a ground-signal-signal-ground (GSSG) structure with an impedance of 100 Ohms, the via 705 can be configured to also have an impedance of 100 Ohms.

Figure 8A:
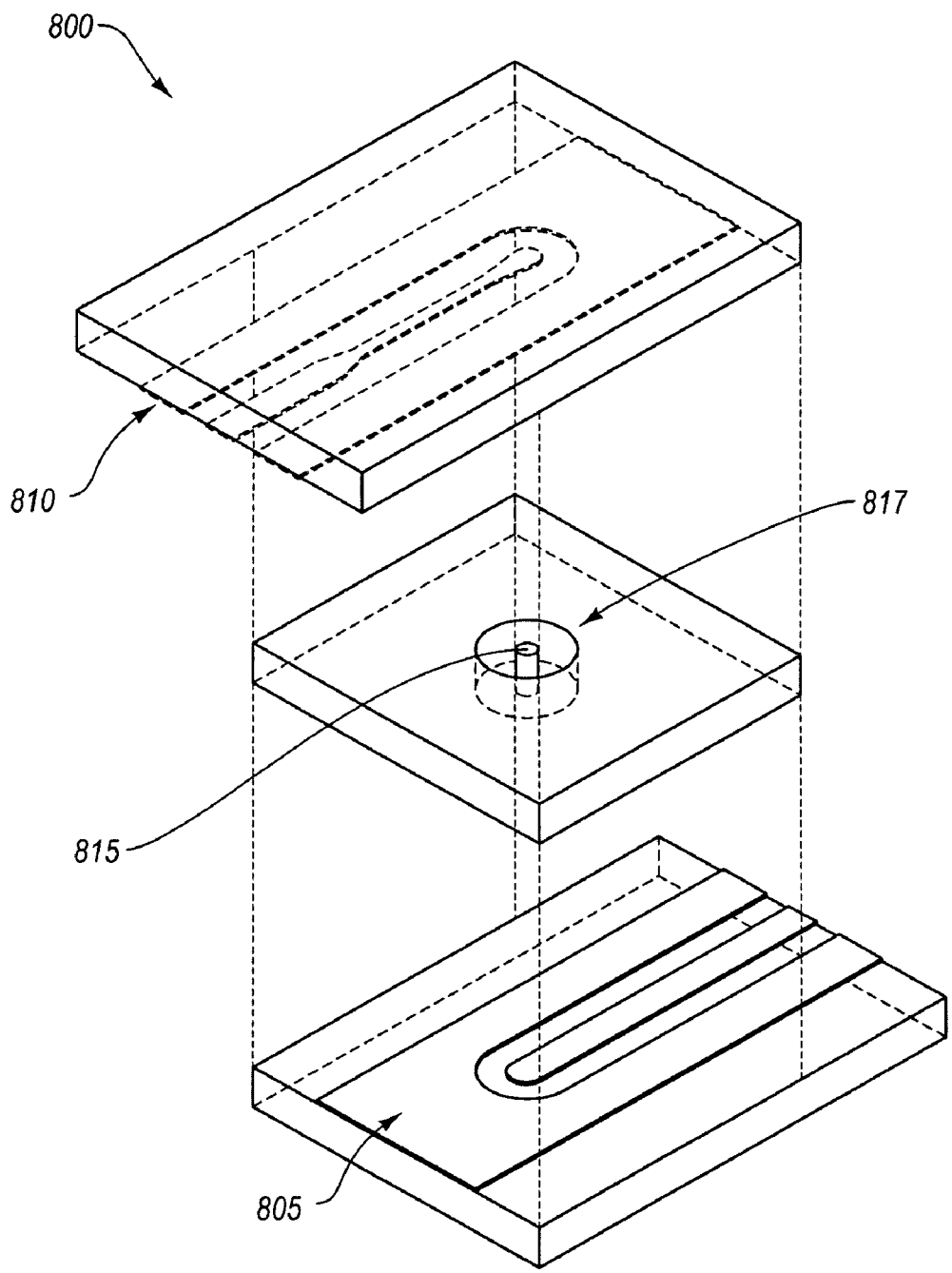
FIG. 8A illustrates a perspective view of an example feed thru.
Figure 8B:
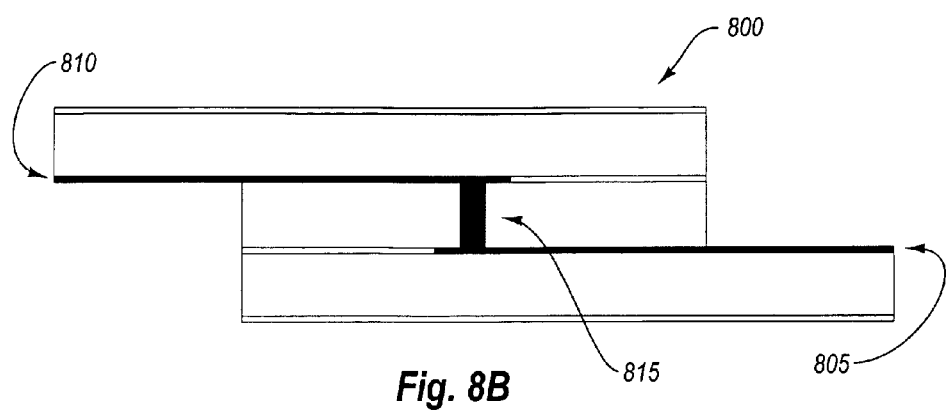
FIG. 8B illustrates a side view of an example feed thru.
Figure 8C:
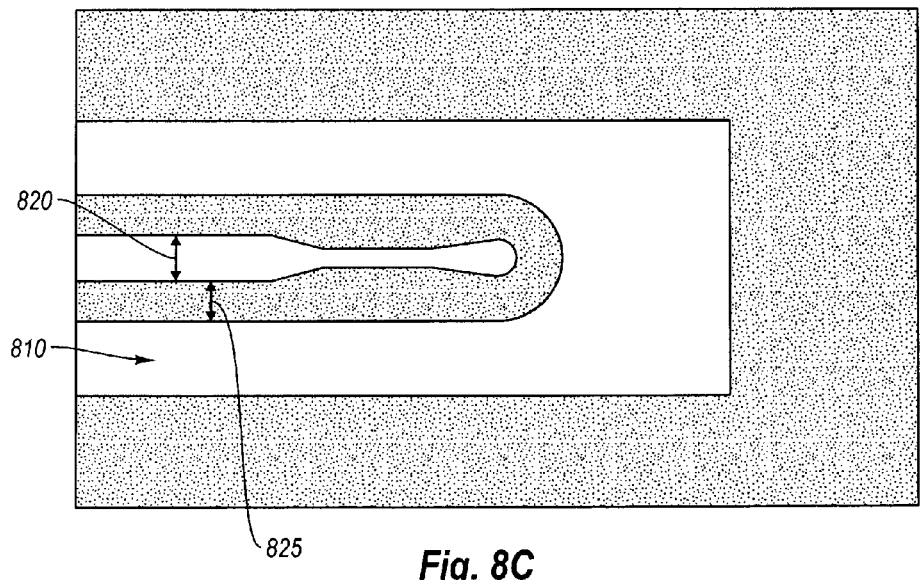
FIG. 8C illustrates a top view of a coplanar structure in an example feed thru.

FIGS. 8A, 8B and 8C illustrate an example feed thru 800. FIG. 8A illustrates a perspective view of the example feed thru 800. FIG. 8B illustrates a side view of the example feed thru 800. FIG. 8C illustrates a top view of the first coplanar structure 810 in the example feed thru 800. The example feed thru 800 can be based on a 50 Ohm single-ended GSG structure. In some embodiments, the feed thru connects a first coplanar structure 805 and a second coplanar structure 810 using at least one guided via 815. In some embodiments, the first coplanar structure 805 is connected to a high speed circuit and the second coplanar structure 810 is connected to a high speed circuit. In some embodiments, the trace width 820 and gap width 825 of the coplanar structures of the coplanar structures 805 and 810 are about 300 um and about 180 um, respectively. In some embodiments, the feed thru may be formed from about 500 um thick ceramic material, with a dielectric constant equal to about 9.2. One of skill in the art can appreciate that these dimensions are by way of example and can be adapted to accommodate other configurations, impedances, and/or transmission rates.

In some embodiments, signal guided vias 815 can be used to connect the signal traces and ground guided vias can be used to connect the ground traces at different coplanar structures 805 and 810. In some embodiments, ground guided vias surrounding a signal guided via can be used to design the 50 Ohm impendence of the structure. Thus, the placement, structure or other configuration of the guided vias used to connect the ground planes can be used to achieve the desired impedance.

In other embodiments, the feed thru 800 can have a variety of different transmission line structures including, but not limited to, ground-signal-ground-signal-ground (GSGSG) differential pair, and ground-signal-signal-ground (GSSG) differential pair. In some embodiments, a GSGSG differential pair may be treated as two independent single-ended GSG structures. The desired impedance of the feed thru 800 can depend on the transmission line structure used, as well as other factors. In some embodiments, the impedance of the feed thru 800 can be configured to match the impedance of the structures being connected using a guided via.

Figure 8D:
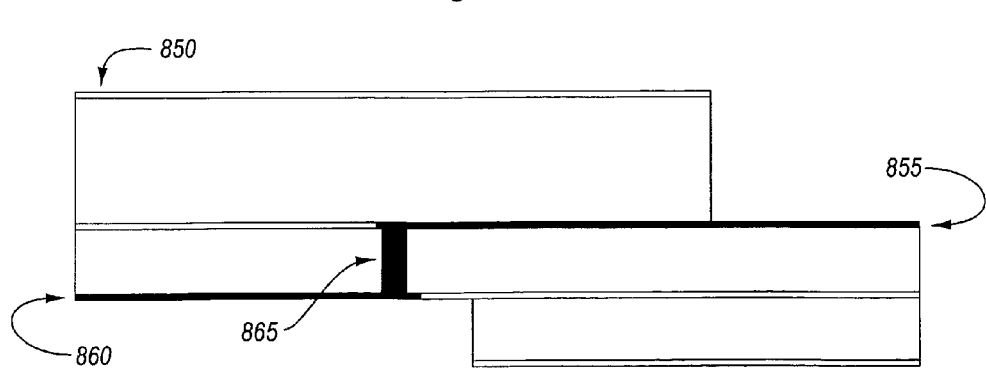
FIG. 8D illustrates a side view of an example feed thru in which the guided via is outside a housing.

FIG. 8D illustrates a high speed feed thru in which the guided via is outside a housing; i.e. the signal flip occurs outside a housing. One of skill in the art can appreciate that that the via can also be placed inside the housing; i.e. that the signal flip need not occur within the housing as shown in FIGS. 8A-8C or outside the housing as shown in FIG. 8D, but can occur inside the housing.

In some embodiments, the feed thru connects a first coplanar structure 855 and a second coplanar structure 860 using at least one guided via 865. In some embodiments, signal guided vias 865 can be used to connect the signal traces and ground guided vias can be used to connect the ground traces at different coplanar structures 855 and 860. In some embodiments, ground guided vias surrounding a signal guided via can be used to design the 50 Ohm impendence of the structure. Thus, the placement, structure or other configuration of the guided vias used to connect the ground planes can be used to achieve the desired impedance.

Figure 9A:
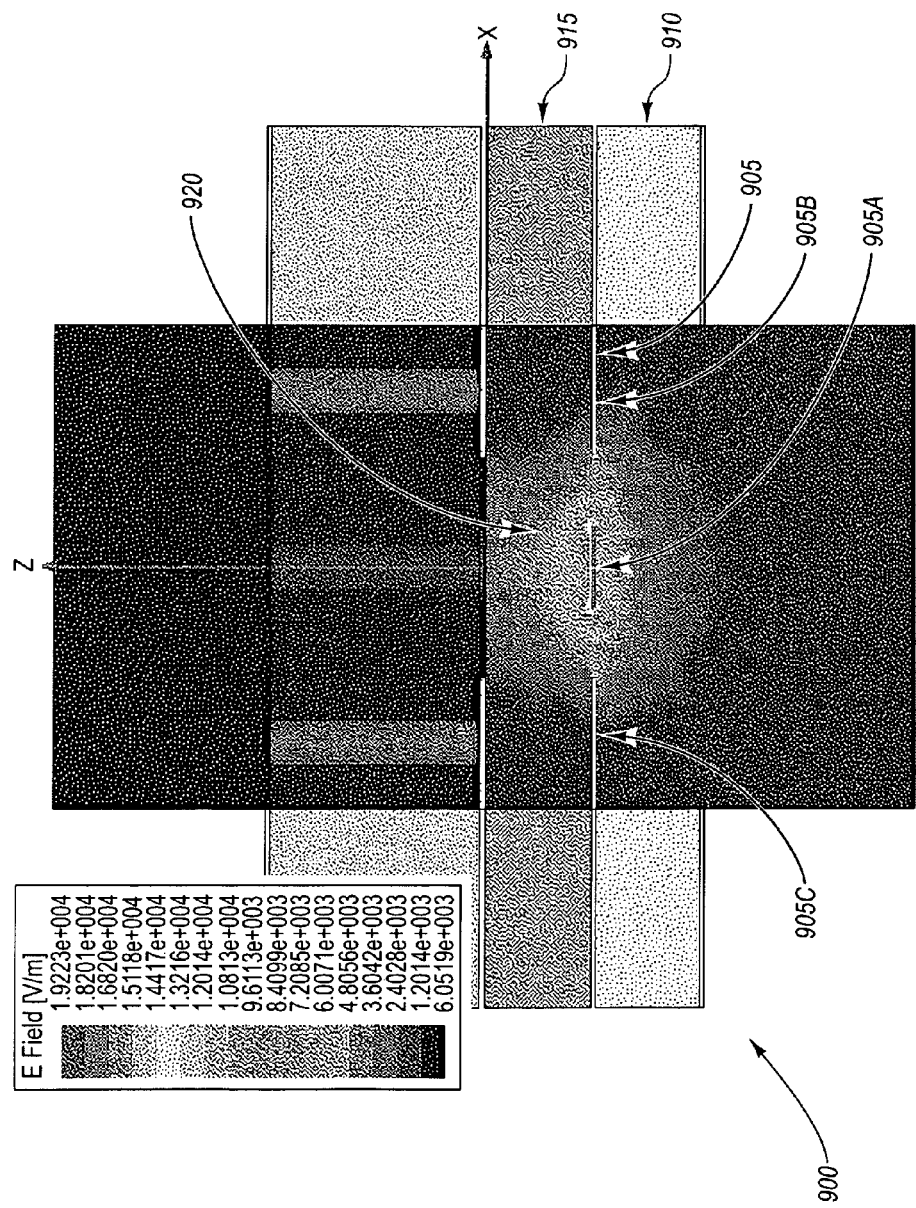
FIG. 9A illustrates an example of a simulated field distribution at an input port of an example feed thru.

FIG. 9A illustrates an example of a simulated filed distribution 900 at an input port of an example feed thru. The coplanar structure 905 is a GSG structure with the signal trace 905A between ground traces 905B and 905C. The material 915 separates the inside and outside coplanar structures, and the guided via passes through the material 915. The simulated electric field 920 is concentrated around the signal plane (i.e. the plane containing the coplanar structure 905) of the coplanar device. This indicates strong coupling within the coplanar structure 905, which may allow for higher speeds within the feed thru.

Figure 9B:
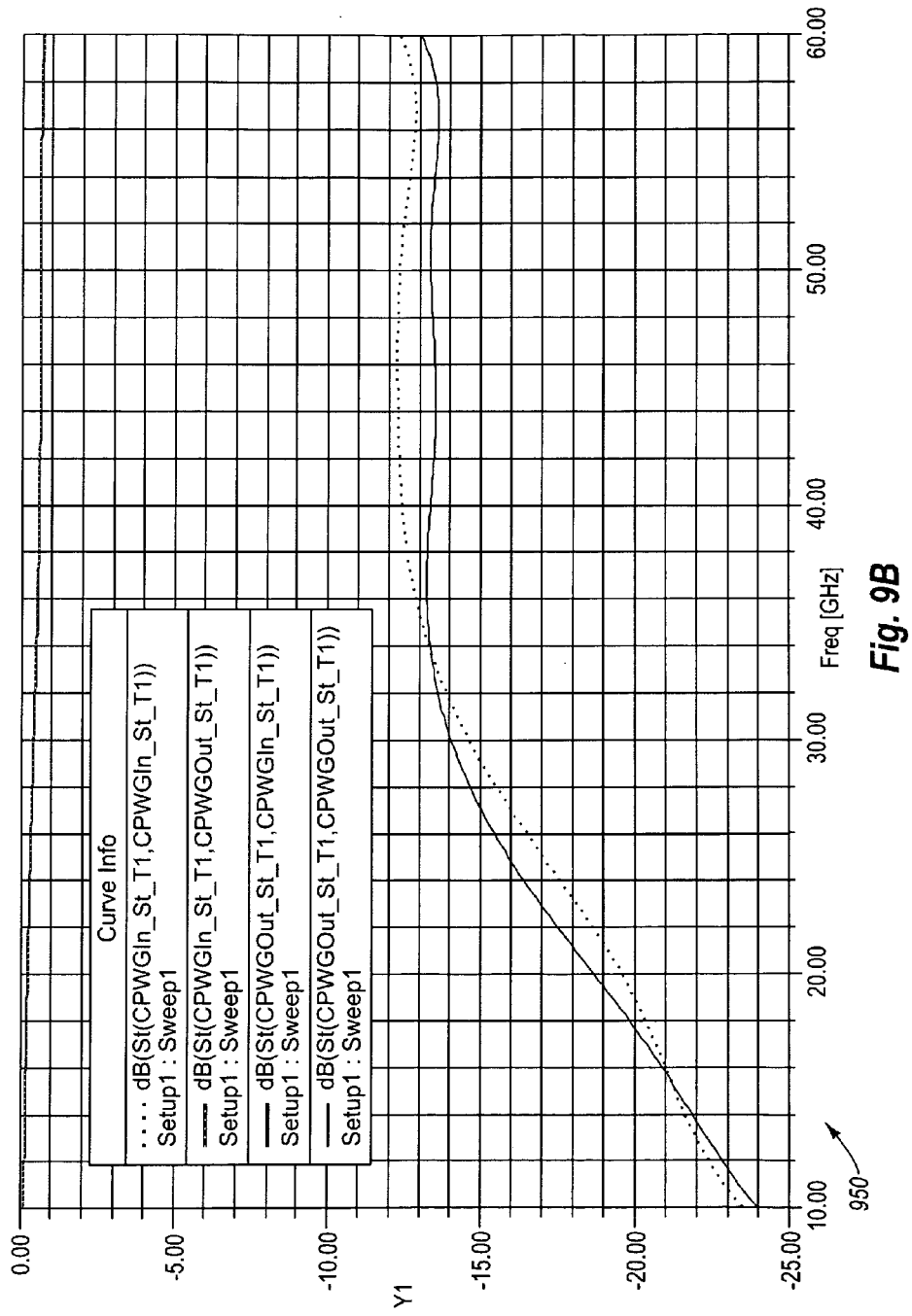
FIG. 9B illustrates and example of S-parameters at an input port of an example feed thru.

FIG. 9B illustrates an example of simulated S-parameters 950 of an example feed thru. Scattering parameters or S-parameters are properties used in electrical engineering, electronics engineering, and communication systems engineering describing the electrical behavior of linear electrical networks when undergoing various steady state stimuli by small signals. Low S-parameters indicate that the electrical signal is transmitted rather than scattered throughout the coplanar structure. If the S-parameters are sufficiently low, the electrical signal can be transmitted at higher frequencies. For example, S21<3 dB and S11<-10 dB may be required to transmit the high speed signal without significant distortion. The simulated S-parameters 950 of the example feed illustrate that the feed thru can operate at frequencies of 25 GHz, 40 GHz and up to and above about 60 GHz. Additionally, the simulated S-parameters 950 show that there is no resonance in the feed thru at speeds up to 60 GHz.

Figure 10:
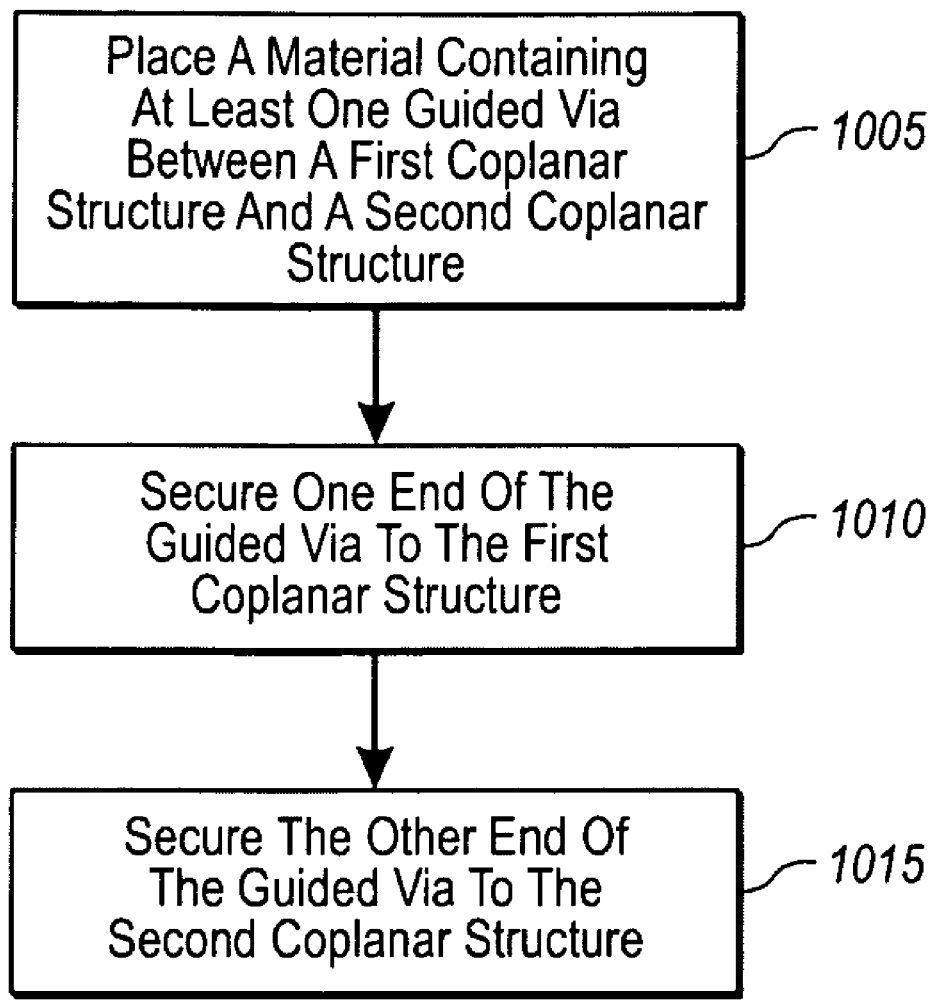
FIG. 10 illustrates a flow diagram of a method for coupling a first coplanar structure to a second coplanar structure.

FIG. 10 illustrates a flow diagram of a method 1000 for coupling a first coplanar structure to a second coplanar structure. In some embodiments the coplanar structures are separated by a medium, such as a housing or some other medium that prevents direct coupling. In some embodiments, the outside coplanar structure is "upside-down" with respect to the inside coplanar structure. This results in the signal plane inside the package being flipped with respect to the signal plane outside the package.

The method 1000 includes placing a material 1005 containing at least one guided via between the first coplanar structure and the second coplanar structure. The guided via provides a conductive path of a specified impedance in this example to facilitate transmission of high speed signals between the first and second coplanar structures. Configuring the impedance of the guided via can be accomplished through composition of the guided via, the conductive material used in the guided via, the size of the guided via, the connection between the guided via and a coplanar structure or through some other method. For example, if the inside coplanar structure and the outside coplanar structure have a GSG structure with an impedance of 50 Ohms, the guided via can be configured to also have an impedance of 50 Ohms. Alternatively, if the inside coplanar structure and outside coplanar structure have a GSSG structure with an impedance of 100 Ohms, the guided via can be configured to also have an impedance of 100 Ohms.

The method 1000 also includes securing 1010 one end of the guided via to the first coplanar structure. Securing can involve any activity which ensures that a conductive path exists between the first coplanar structure and the second coplanar structure. For example, the connections can have pads shaped to ensure a conductive pathway between the pads and the guided via and to control the impedance of the connection.

The method 1000 further includes securing 1015 the other end of the guided via to the second coplanar structure. In some embodiments, the method used to secure the second end of the guided via to the second coplanar structure can be the same method used to secure the first end of the guided via to the first coplanar structure. In other embodiments, the method used to secure the second end of the guided via to the second coplanar structure can be a different method than the one used to secure the first end of the guided via to the first coplanar structure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A high speed feed thru connecting a first circuit outside a housing to a second circuit inside the housing, wherein the first circuit includes a first high speed integrated circuit chip and the second circuit includes a second high speed integrated circuit chip or optoelectronic device, the high speed feed thru comprising:
    an inside coplanar structure positioned at least partially inside the housing, the inside coplanar structure connected to the second circuit;
    an outside coplanar structure positioned at least partially outside the housing, the outside coplanar structure connected to the first circuit;
    a material separating the inside coplanar structure and the outside coplanar structure; and
    at least one guided via extending through the material, wherein the at least one guided via connects the inside coplanar structure and the outside coplanar structure and wherein a signal plane of the inside coplanar structure is flipped with respect to a signal plane of the outside coplanar structure.

2. A high speed feed thru according to claim 1, wherein the at least one guided via carrying a signal is surrounded by at least one ground via.

3. A high speed feed thru according to claim 1, wherein the outside coplanar structure is further connected to a printed circuit board including a set of coplanar high speed traces and, wherein the second circuit is connected to the set of coplanar high speed traces.

4. A high speed feed thru according claim 1, wherein the high speed feed thru is an integral part of a transponder or a transceiver.

5. A high speed feed thru according to claim 1, wherein:
    the inside coplanar structure includes a single-ended ground-signal-ground (GSG) structure with strong coupling or a differential pair ground-signal-signal-ground (GSSG) structure with strong coupling;
    the outside coplanar structure includes a single-ended GSG structure with strong coupling or a differential pair GSSG structure with strong coupling.

6. A high speed feed thru according claim 1, wherein the first circuit comprises at least one of an optical circuit or an integrated circuit and the second circuit comprises at least one of an optical circuit or an integrated circuit.

7. A high speed feed thru according to claim 1, wherein the feed thru is configured to relay signals at or greater than about 25 Gb/s.

8. A high speed feed thru according to claim 1, wherein the first circuit comprises a first temperature control circuit and the second circuit comprises a second temperature control circuit.

9. A high speed feed thru according to claim 8, wherein the first temperature control circuit includes the second temperature control circuit.

10. A high speed feed thru according to claim 1, wherein an impedance of the at least one guided via is controlled using a pad at one or both ends of the at least one guided via to connect the at least one guided via to the outside coplanar structure and the inside coplanar structure.

11. A high speed feed thru according to claim 10, wherein impedance of the at least one guided via is 50 Ohms for single-ended configurations or 100 Ohms for differential configurations.

* * * * *